(12) United States Patent
Schrödinger

(10) Patent No.: US 6,587,489 B2
(45) Date of Patent: Jul. 1, 2003

(54) ELECTRONIC DRIVER CIRCUIT FOR DIRECTLY MODULATED SEMICONDUCTOR LASERS

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 55 days.

(21) Appl. No.: 09/790,027

(22) Filed: Feb. 21, 2001

(65) Prior Publication Data

US 2002/0085599 A1 Jul. 4, 2002

(30) Foreign Application Priority Data

Dec. 29, 2000 (DE) .......................................... 100 65 838

(51) Int. Cl.[7] .................................................. H01S 3/00
(52) U.S. Cl. ................................ 372/29.01; 372/29.015
(58) Field of Search ........................... 372/24.01, 29.015

(56) References Cited

U.S. PATENT DOCUMENTS

| | | | |
|---|---|---|---|
| 3,898,583 A | * 8/1975 | Shuey | 372/29.021 |
| 4,835,780 A | 5/1989 | Sugimura et al. | |
| 5,119,392 A | 6/1992 | Childs | |
| 5,376,900 A | * 12/1994 | Debroux | 330/271 |
| 5,651,017 A | * 7/1997 | Genovese | 372/38.02 |
| 5,724,088 A | * 3/1998 | Genovese | 347/246 |
| 5,999,849 A | * 12/1999 | Gord et al. | 327/104 |

FOREIGN PATENT DOCUMENTS

| | | |
|---|---|---|
| DE | 37 41 305 A1 | 6/1989 |
| DE | 40 25 497 C2 | 2/1992 |
| EP | 0 464 813 B1 | 1/1992 |
| EP | 0 952 644 A2 | 10/1999 |
| JP | 01-202878 | 8/1989 |

* cited by examiner

*Primary Examiner*—Paul Ip
*Assistant Examiner*—Dung T Nguyen
(74) *Attorney, Agent, or Firm*—Laurence A. Greenberg; Werner H. Stemer; Gregory L. Mayback

(57) ABSTRACT

An electronic driver circuit for directly modulated semiconductor lasers is described. The drive circuit has a first circuit for generating a constant current and a second circuit for modulating the constant current. The second circuit generates, as a function of a digital data signal, a modulation current that is superimposed on the constant current, the modulated current being fed to a semiconductor laser. According to the invention, a third circuit is additionally provided which keeps the driver circuit at a low impedance during a rising edge and/or a falling edge of the current through the semiconductor laser. As a result, the signal shape of the optical output signals of the semiconductor laser can be improved, and the driver circuit can be operated at higher data rates, in particular at data rates of up to 12 Gbit/s.

5 Claims, 3 Drawing Sheets

ELECTRONIC DRIVER CIRCUIT FOR DIRECTLY MODULATED SEMICONDUCTOR LASERS

BACKGROUND OF THE INVENTION

Field of the Invention

The invention relates to an electronic driver circuit for directly modulated semiconductor lasers. The driver circuit has a first circuit for generating a constant current and a second circuit for modulating the constant current. The second circuit generates a modulating current superimposed on the constant current in dependence on a digital data signal and the superimposed current is fed to the laser.

It is known to use laser diodes for generating light in optical data transmission systems. The optical output power of a laser diode is defined here by the driver circuit that feeds to the laser diode a biasing current that is modulated as a function of the data signal which is to be transmitted.

The disadvantage of the known circuit relates to the fact that its speed is limited owing to a high output resistance of the circuit, and owing to a normally relatively high-impedance laser internal resistance (in particular when vertical cavity surface emitting lasers (VCSELs) are used). This is disadvantageous in particular at high bit rates in the gigahertz range.

SUMMARY OF THE INVENTION

It is accordingly an object of the invention to provide an electronic driver circuit for directly modulated semiconductor lasers which overcomes the above-mentioned disadvantages of the prior art devices of this general type, which can drive directly modulated semiconductor lasers even at high data rates of up to 12 Gbit/s.

With the foregoing and other objects in view there is provided, in accordance with the invention, an electronic driver circuit for directly modulated semiconductor lasers. The driver circuit contains a first circuit for generating a constant current, and a second circuit for modulating the constant current and connected to the first circuit. The second circuit, in dependence on a digital data signal, superimposes a modulation current on the constant current resulting in a laser current to be fed to a semiconductor laser. A third circuit is provided for keeping components of the first circuit and the second circuit at a low impedance during a rising edge and a falling edge of the laser current fed to the semiconductor laser. The third circuit is connected to the first circuit and the second circuit.

According to the above, the invention provides a circuit which keeps the driver circuit at low impedance at a rising edge of the current and/or respectively at a falling edge of the current through the semiconductor laser. The driver is thus kept at low impedance during the switching on or off of the modulation current. As a result, peaking of the rising and/or falling edges of the signal or current through the semiconductor laser is achieved.

As a result of the peaking, parasitic elements of the driver circuit such as parasitic inductances and capacitances can be compensated, and an improved, optical signal shape is correspondingly made available so that the laser diode can be operated even at high data rates of up to 12 Gbit/s.

In a preferred embodiment of the invention, when the current through the semiconductor laser rises, the third circuit makes available an additional current pulse for the semiconductor laser. Such a current pulse can alternatively or additionally also be made available as a negative current pulse for the semiconductor laser when the current falls.

To this end, the third circuit preferably has a transistor whose emitter terminal is connected to the semiconductor laser via a resistor, and whose base current is determined by a base/emitter control voltage that has peaks during the rising edge of the current through the semiconductor laser.

Alternatively, there is provision for the third circuit to make available either positive or negative voltage peaks corresponding to the rising and falling edges of the current through the semiconductor laser. A constant current that is modulated in accordance with an applied base/emitter control voltage is generated at the transistor by a current mirror.

Other features which are considered as characteristic for the invention are set forth in the appended claims.

Although the invention is illustrated and described herein as embodied in an electronic driver circuit for directly modulated semiconductor lasers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 6:
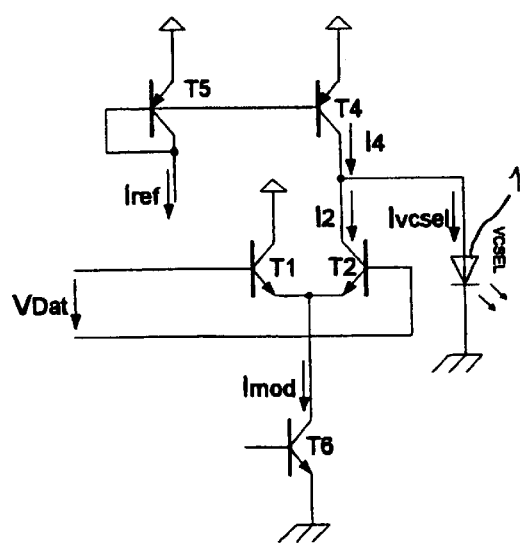
FIG. 6 is a circuit diagram of the driver circuit according to the prior art.

In all the figures of the drawing, sub-features and integral parts that correspond to one another bear the same reference symbol in each case. Referring now to the figures of the drawing in detail and first, particularly, to FIG. 6 thereof, there is shown a known driver circuit for directly modulating a semiconductor laser or a laser diode 1. Two transistors T4, T5 are provided for generating a constant current (biasing current) I4. The transistor T5 constitutes here a current mirror for the transistor T4, that is to say the two transistors and associated currents are identical. As a result, a reference current Iref flowing through the transistor T5 is impressed on the transistor T4 as a constant current I4. The constant current I4 flows into the laser diode 1 when a transistor T2 is non-conducting. The current flowing through the laser diode 1 is equal to I4 (Ivcsel=I4).

The laser diode 1 is preferably a surface-emitting vertical cavity surface emitting laser (VCSEL) diode which usually has a high internal resistance.

Furthermore, a differential amplifier is provided, which is formed by two transistors T1, T2 whose emitter terminals are connected to a power source T6. An input voltage VDat that represents the digital data signal which is to be transmitted is connected to base terminals of the transistors T1, T2. If a logic signal is applied, a current I2 flows through the transistor T2, with the result that the current flowing through the laser diode 1 is reduced by the current I2 (Ivcsel=I4−I2). The current through the laser diode 1, and thus an optical output power of the laser diode 1 is thus modulated in dependence on the signal VDat. Here, the current I2 is usually less than or equal to the current I4 because the threshold current of the laser 1 should always flow. The current Imod that essentially corresponds to the current I2 flows through the transistor T6.

The disadvantage of the known circuit relates to the fact that its speed is limited owing to a high output resistance of the circuit (at the collectors of the transistors T2, T4), and owing to a normally relatively high-impedance laser internal resistance (in particular when VCSEL lasers are used). This is disadvantageous in particular at high bit rates in the gigahertz range.

Figure 1:
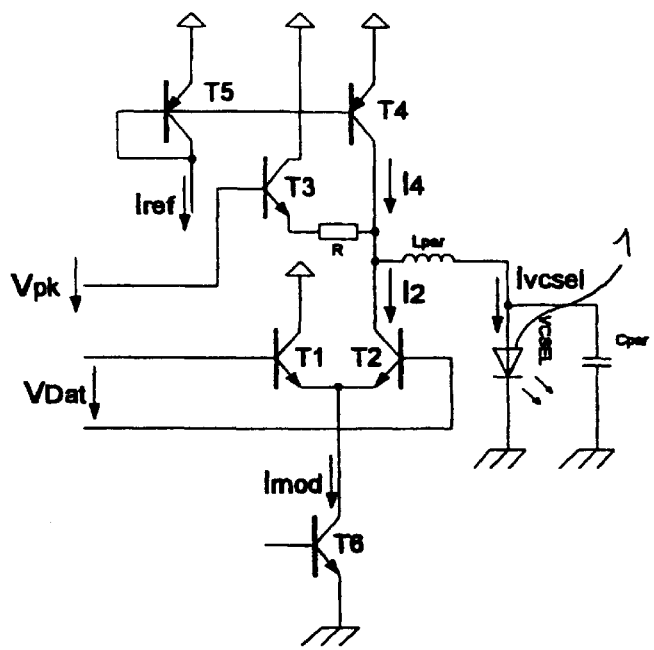
FIG. 1 is a circuit diagram of a first embodiment of a driver circuit according to the invention.

This is solved by the driver circuit according to the invention and shown in FIG. 1. The driver circuit in FIG. 1 has, in addition to the current mirror circuit formed from the transistors T4, T5, the differential amplifier formed from the transistors T1, T2, and the power source T6 for the modulation current Imod, a NPN-type transistor T3 and a resistor R are provided. The resistor R is used here to limit the current and must be dimensioned to correspond to the required time constant.

A collector terminal of the transistor T3 is connected to a reference voltage. An emitter terminal of the transistor T3 is connected through the resistor R to a node between the transistors T2 and T4 to which the laser diode 1 is connected. A current flow through the transistor T3 is controlled by a base current which is generated by a base-emitter control voltage Vpk which respectively makes available a voltage pulse at the rising edge of a data signal. The voltage pulses of the voltage Vpk are triggered here by the data signal to be transmitted, for example.

By use of the voltage pulses, an additional current pulse, which more quickly charges the "laser diode 1", is made available at a rising edge of the signal current through the laser diode 1. As a result parasitic elements, such as the inductances $L_{par}$ and $C_{par}$ indicated can be compensated.

As a result of the additional current pulses, the driver circuit goes into a low-impedance state in each case during the rising or falling edge of the current through the laser diode 1.

Figure 2:
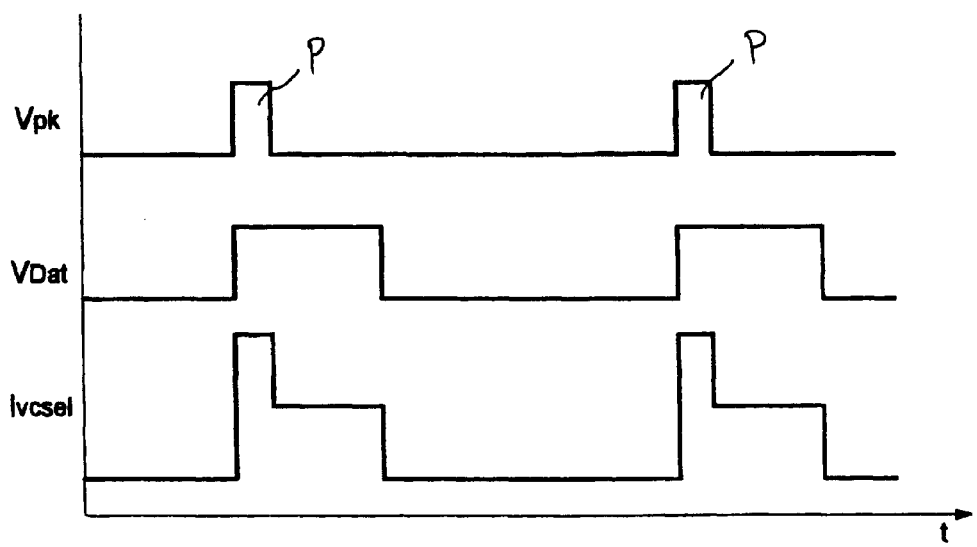
FIG. 2 is a graph of a timing sequence of signals of the driver circuit shown in FIG. 1.

FIG. 2 is a respective voltage and current diagram as a function of time. The middle signal represents, as Vdat, the data signal that is to be transmitted and which is applied to the differential amplifier formed by the transistors T1, T2. When a high level is present, the signal shape of the current Ivcsel through the laser diode 1 changes appropriately.

Due to the voltage Vpk which is applied to the base terminal of the transistor T3, additional "peaking pulses" P are generated, which make available additional current pulses at the rising edges of the signal current Ivcsel through the laser diode 1.

Figure 3:
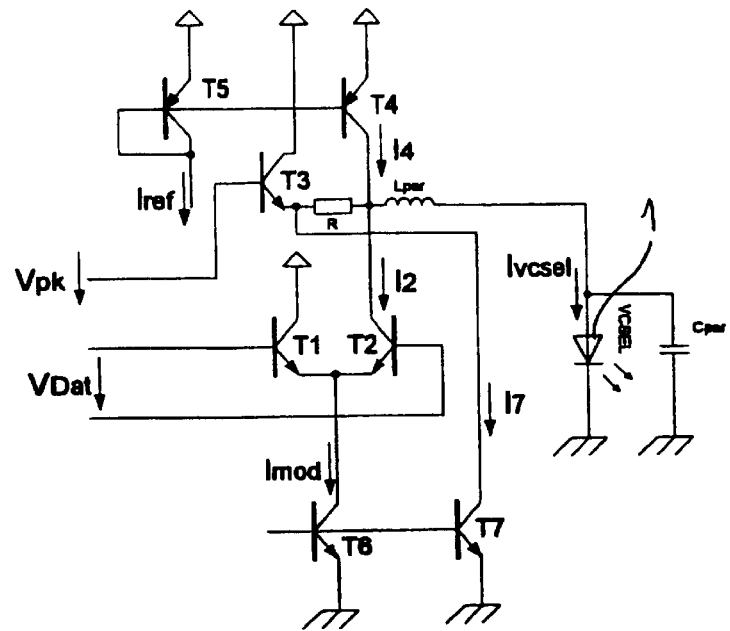
FIG. 3 is a circuit diagram of a second exemplary embodiment of the driver circuit according to the invention.

In the alternative exemplary embodiment in FIG. 3, a bi-directional peaking of the current Ivcsel through the laser diode 1 takes place, that is to say peaking pulses occur both on the rising and falling edges of the signal.

Here, an additional current I7 through the transistor T3 is provided, which current I7 is generated by a current mirror transistor T7. As a result, the transistor T3 is always kept in the active operating mode even if the emitter voltage of T3 drops below an anode voltage of the laser diode 1. This makes it possible to impress (negative) peaking pulses also on the negative edge of the signal and thus also to accelerate the negative edge of the signal. Here, the constant current I4 must possibly be somewhat increased so that the current conditions in the laser 1 do not change as a result of any power losses from the current I4 through the resistor R and the transistor T7. This is dependent on the dimensioning of the resistor R, the voltage Vpk and the current I7.

Figure 4:
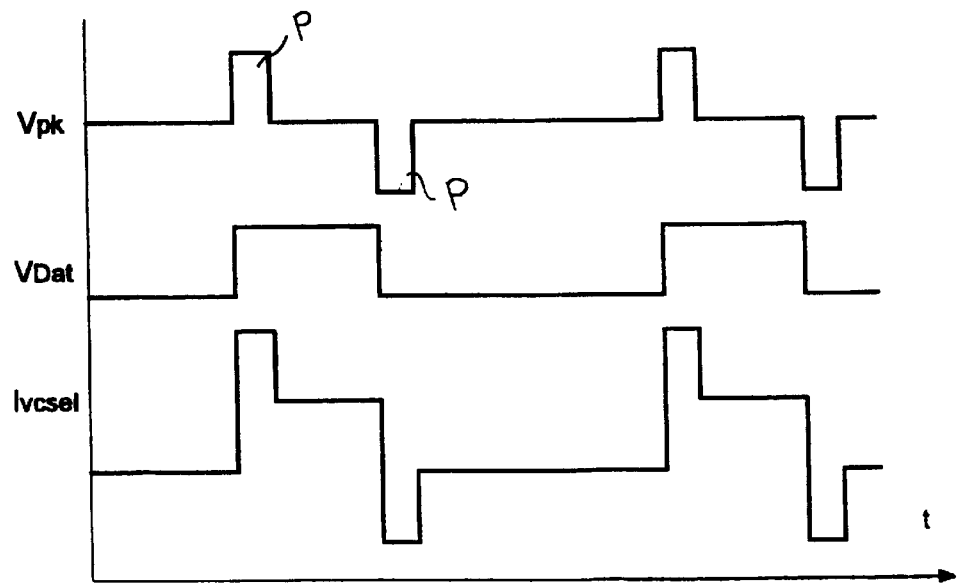
FIG. 4 is a graph of the timing sequence of the signals of the driver circuit shown in FIG. 3.

FIG. 4 shows the associated signal profiles as a function of time. The data signal that is to be transmitted is present in turn as the voltage VDat at the differential amplifier with the transistors T1, T2. A positive or negative peaking pulse P is present at the base terminal of the transistor T3 in each case as the voltage Vpk, at the rising edge and the falling edge of the data signal. This leads to a situation in which the current Ivcsel through the laser diode 1 is increased or decreased at the respective edges.

Figure 5:
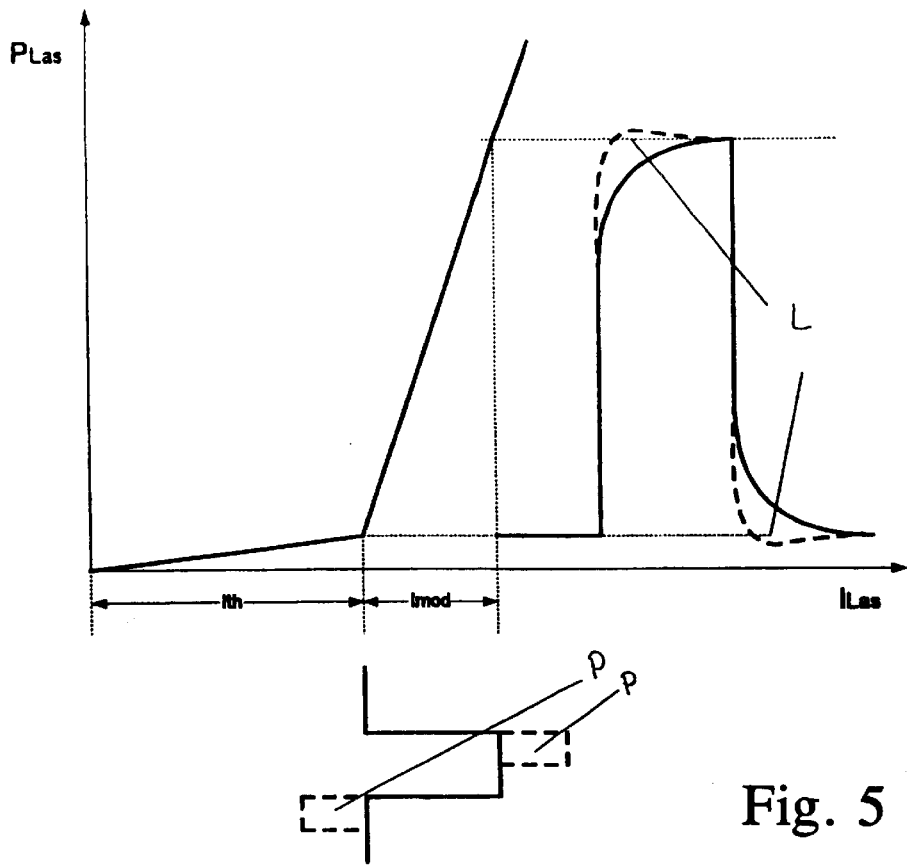
FIG. 5 is a graph of a laser characteristic curve for driver currents of the driver circuit shown in FIG. 3.

FIG. 5 shows the laser characteristic curve of the laser 1 when the driver currents according to FIGS. 1 and 3 are used.

Here, a light power $P_{Las}$ of the laser diode 1 is represented as a function of the current $I_{Las}$ through the laser. The current through the laser diode is a constant current (corresponding to I4 in FIGS. 1 and 3) which is applied to the laser point Ith. The modulation current Imod is applied to this.

Given a square-wave modulation current Imod, the output power $P_{Las}$ of the laser has a distortion of the signal shape at the rising or falling edges of the light signal, corresponding to the unbroken line. When the peaking pulses P shown by broken lines, are used according to the invention, the optical signal shape of an output signal L is significantly improved and a square-wave signal is closely approximated (dashed signal shape L). This makes it possible to operate the laser diode even at high data rates of up to 12 Gbit/s.

It is to be noted that the circuitry principle described can also be used for CMOS circuits. Here, NPN-type transistors are replaced by n-type channel FETs and PNP-type transistors are replaced by p-type channel FETs. The speed of the driver circuit is then predefined by the transistor bandwidth.

The embodiments of the invention are not restricted to those illustrated above. The sole important factor for the invention is that the driver circuit provides additional switching devices which keep the driver circuit respectively at low impedance at a rising and/or falling edge of the current through the laser diode.

I claim:

1. An electronic driver circuit for directly modulated semiconductor lasers, comprising:

a first circuit for generating a constant current;

a second circuit for modulating the constant current and connected to said first circuit, said second circuit, in dependence on a digital data signal, superimposing a modulation current on the constant current resulting in a laser current to be fed to a semiconductor laser; and a third circuit for keeping components of said first circuit and said second circuit at a low impedance during a rising edge and a falling edge of the laser current fed to the semiconductor laser, said third circuit connected to said first circuit and said second circuit.

2. The driver circuit according to claim 1, wherein said third circuit provides an additional current pulse for the semiconductor laser when the laser current rises.

3. The driver circuit according to claim 1, wherein said third circuit provides an additional negative current pulse for the semiconductor laser when the laser current falls.

4. The driver circuit according to claim 1, wherein said third circuit has a transistor with an emitter terminal and a resistor with a first terminal connected to said emitter terminal and a second terminal to be connected to the semiconductor laser, a base current of said transistor is determined by a base/emitter control voltage which has peaks during the rising edge of the laser current through the semiconductor laser.

5. The driver circuit according to claim 1,
wherein said third circuit has a transistor with an emitter terminal and a resistor with a first terminal connected to said emitter terminal and a second terminal to be connected to the semiconductor laser;

wherein a base current of said transistor is determined by a base/emitter control voltage which has positive and negative voltage peaks corresponding to the rising edge and the falling edge, respectively, of the laser current through the semiconductor laser; and including a current mirror connected to said third circuit, said current mirror in conjunction with said transistor generating a further constant current being modulated in accordance with the base/emitter control voltage.

\* \* \* \* \*